US009906223B1

United States Patent
Pelley

(10) Patent No.: US 9,906,223 B1
(45) Date of Patent: Feb. 27, 2018

(54) SMALL SIGNAL INPUT BUFFER

(71) Applicant: FREESCALE SEMICONDUCTOR, INC., Austin, TX (US)

(72) Inventor: Perry H. Pelley, Austin, TX (US)

(73) Assignee: NXP USA, INC., Austin, TX (US)

( * ) Notice: Subject to any disclaimer, the term of this patent is extended or adjusted under 35 U.S.C. 154(b) by 0 days.

(21) Appl. No.: 15/278,166

(22) Filed: Sep. 28, 2016

(51) Int. Cl.
*H03K 3/00* (2006.01)
*H03K 17/687* (2006.01)

(52) U.S. Cl.
CPC ............... *H03K 17/6872* (2013.01)

(58) Field of Classification Search
CPC ....... H03K 19/00315; H03K 19/00361; H03K 19/0013; H03K 3/012; H03K 19/00346; H03K 19/018521; H03K 5/02
See application file for complete search history.

(56) References Cited

U.S. PATENT DOCUMENTS

| | | | |
|---|---|---|---|
| 4,504,747 A | 3/1985 | Smith et al. | |
| 6,107,863 A * | 8/2000 | Iwata | H03K 19/0013 327/536 |
| 6,414,517 B1 | 7/2002 | Kim et al. | |
| 6,960,925 B2 | 11/2005 | Zivanovic | |
| 7,893,731 B2 | 2/2011 | Peterson | |
| 8,854,104 B2 * | 10/2014 | Chung | H03L 5/00 326/80 |
| 9,374,093 B2 | 6/2016 | Pelley et al. | |
| 2014/0184299 A1 * | 7/2014 | Chung | H03L 5/00 327/333 |

* cited by examiner

*Primary Examiner* — Long Nguyen

(57) ABSTRACT

A buffer circuit includes a first capacitor having a first terminal coupled to receive an input signal, a second capacitor having a first terminal coupled to the first terminal of the first capacitor, and a latching portion coupled to a second terminal of the first capacitor and a second terminal of the second capacitor. The latching portion provides an output signal. A first transistor includes a control electrode coupled to receive the output signal, a first current electrode coupled to a first bias voltage supply terminal, and a second current electrode coupled to the second terminal of the second capacitor.

20 Claims, 3 Drawing Sheets

SMALL SIGNAL INPUT BUFFER

BACKGROUND

Field

This disclosure relates generally to input buffers, and more specifically, to small signal input buffers.

Related Art

Integrated circuits typically include input buffers to condition signals received from an external source. As semiconductor process technology advances, integrated circuit feature sizes (e.g. transistor gate length) continue to decrease. With smaller feature sizes, integrated circuits can be higher performing and operate at lower voltages. These higher performing integrated circuits generally transmit and receive signals at higher frequencies and with smaller voltage swings. It becomes increasingly challenging to be able to receive and condition such higher frequency, smaller voltage swing signals.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Generally, there is provided, a buffer circuit and method to condition signals without excessive current drain and die area. The buffer circuit allows high frequency signals having a voltage swing of a few hundred millivolts to be received and converted to full rail signals. An input signal is received at a first terminal of a first capacitor and a first terminal of a second capacitor. A latching portion latches a logic value based on a capacitively coupled edge of the input signal at the second terminal of the first capacitor. An output signal of the latching portion is used to pre-charge the second terminal of the first capacitor to a first bias voltage. Similarly, a second logic value can be latched based on a capacitively coupled second edge of the input signal at the second terminal of the second capacitor. The output signal of the latching portion is used to pre-charge the second terminal of the second capacitor to a second bias voltage.

Figure 1:
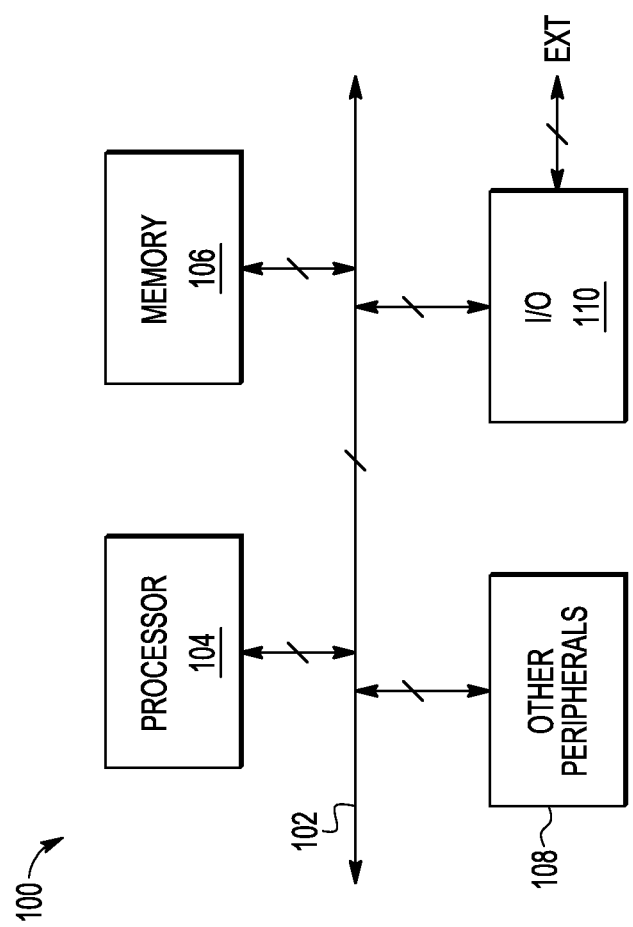
FIG. 1 illustrates, in simplified block diagram form, an integrated circuit in accordance with an embodiment of the present disclosure.

FIG. 1 illustrates, in simplified block diagram form, integrated circuit 100 in accordance with an embodiment of the present disclosure. In some embodiments, integrated circuit 100 may be characterized as a system-on-a-chip (SoC). Integrated circuit 100 includes a system bus 102, processor 104, memory 106, other peripherals 108, and input/output (I/O) circuitry 110. Processor 104, memory 106, other peripherals 108, and I/O 110 are each bidirectionally coupled to system bus 102 by way of respective communication buses. System bus 102 can be any type of bus for communicating any type of information such as data, address, control, and instructions.

Processor 104 may be any type of processor, including circuits for processing, such as a microprocessor (MPU), microcontroller (MCU), digital signal processor (DSP), or other type of processing core. Integrated circuit 100 may include multiple processors like processor 104. Memory 106 may include any type of volatile or non-volatile memory array, such as static random access memory (SRAM), dynamic random access memory (DRAM), flash, etc. Memory 106 may also be coupled directly to processor 104. Other peripherals 108 of integrated circuit 100 may include any number of other circuits and functional hardware blocks such as accelerators, timers, counters, communications, interfaces, analog-to-digital converters, digital-to-analog converters, PLLs, and the like for example. I/O 110 of integrated circuit 100 may include any number of input buffers, output buffers, input/output buffer, and the like for communicating with one or more other integrated circuits.

Figure 2:
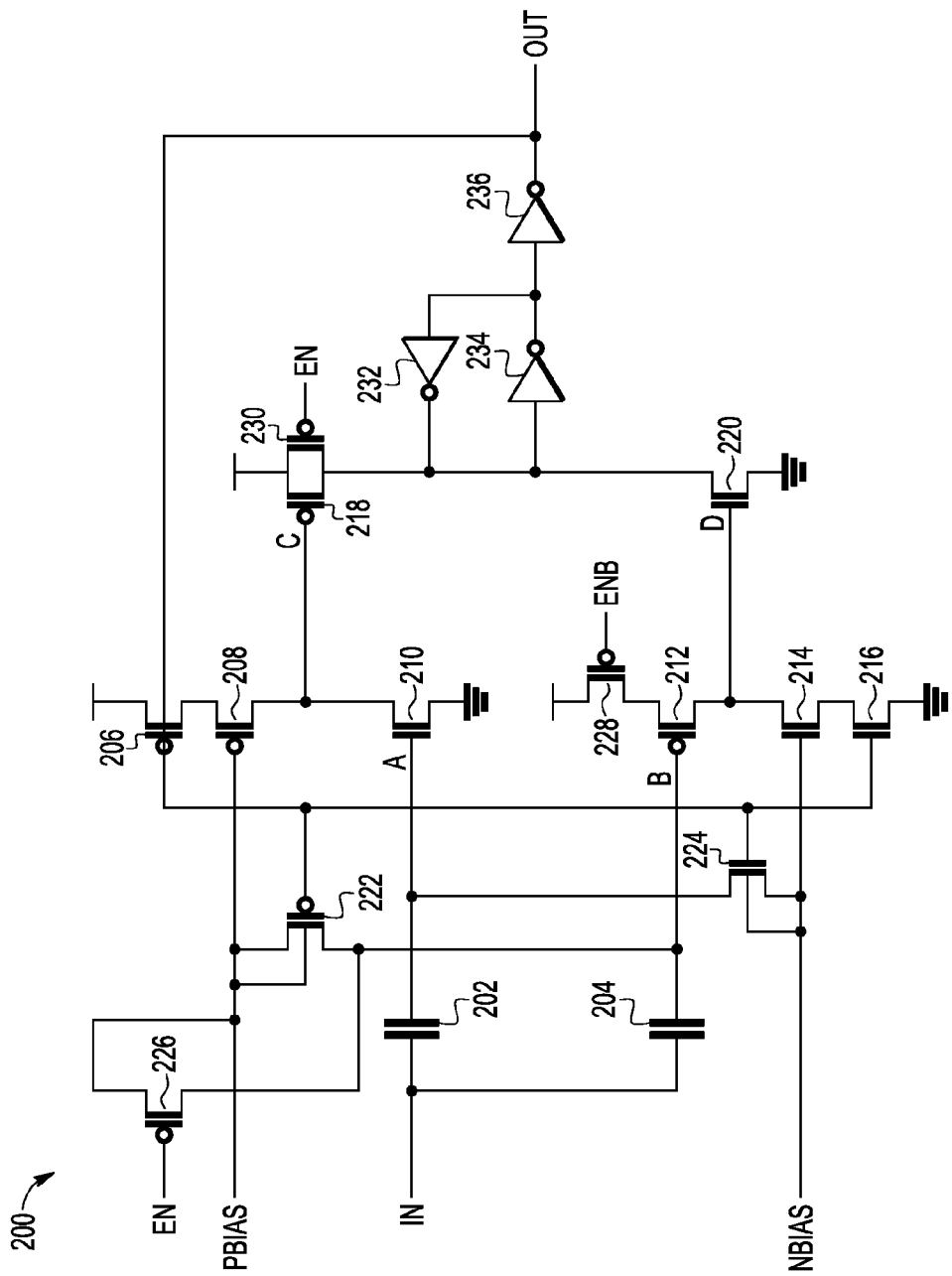
FIG. 2 illustrates, in simplified schematic diagram form, an exemplary buffer circuit in accordance with an embodiment of the present disclosure.

FIG. 2 illustrates, in simplified schematic diagram form, an exemplary input buffer circuit 200 in accordance with an embodiment of the present disclosure. Input buffer 200 includes input terminals to receive input signal (IN), bias signals (PBIAS, NBIAS), and enable signals (EN, ENB), and an output terminal to provide an output signal (OUT). In this embodiment, PBIAS and NBIAS voltage values may be approximately a nominal transistor threshold voltage below VDD and above ground voltages respectively. For example, in a process technology node where a nominal operating voltage (VDD) is at 1.0 volts and nominal P-channel and N-channel threshold voltages are at 350 millivolts, the PBIAS voltage may be approximately 0.650 volts and the NBIAS voltage may be approximately 0.350 volts. Circuitry of input buffer 200 includes a capacitively coupled input portion, a latching portion, a pre-charge portion, and an enable portion.

The capacitively coupled input circuit portion of input buffer 200 includes capacitors 202 and 204 coupled to a first transistor stack (206-210) and a second transistor stack (212-216) respectively. A first terminal of capacitor 202 is coupled to input terminal labeled IN, and a second terminal coupled to a control electrode of N-channel transistor 210 at node labeled A. A first current electrode of transistor 210 is coupled to a first voltage supply terminal (ground) and a second current electrode of transistor 210 is coupled to a first current electrode of P-channel transistor 208 at node labeled C. A control electrode of transistor 208 is coupled to receive bias signal provided at bias voltage supply terminal labeled PBIAS, and a second current electrode is coupled to a first current electrode of P-channel transistor 206. A control electrode of transistor 206 is coupled to output terminal labeled OUT to receive output signal, and a second current electrode is coupled to a second voltage supply terminal (VDD).

A first terminal of capacitor 204 is coupled to input terminal IN, and a second terminal is coupled to a control electrode of P-channel transistor 212 at node labeled B. A first current electrode of transistor 212 is coupled to a first current electrode of P-channel transistor 228, and a second current electrode of transistor 212 is coupled to a first current electrode of N-channel transistor 214 at node labeled D. A control electrode of transistor 214 is coupled to receive bias signal provided at bias voltage supply terminal labeled NBIAS, and a second current electrode is coupled to a first current electrode of N-channel transistor 216. A control electrode of transistor 216 is coupled to receive output signal at output terminal OUT, and a second current electrode is coupled to the ground voltage supply terminal.

Capacitors 202 and 204 may be referred to as capacitive elements and can be formed with any suitable materials and structures available in a given process technology such as metal-oxide-semiconductor (MOS) capacitors, metal-insulator-metal (MIM) capacitors, polysilicon-insulator-polysilicon (PIP) capacitors, deep trench capacitors, and the like, for example. Capacitors 202 and 204 may be formed as a combination of the above capacitor types. For example, each capacitor 202 and 204 may be formed as a MOS capacitor in parallel or in series with a MIM capacitor.

The latching circuit portion of input buffer 200 includes pull-up P-channel transistor 218, pull-down N-channel transistor 220, cross-coupled inverters (232, 234), and driver (236). A first current electrode of transistor 218 is coupled to the VDD voltage supply terminal and a second current electrode is coupled to an output of inverter 232 and input of inverter 234. A control electrode of transistor 218 is coupled to node C. A first current electrode of transistor 220 is coupled to the output of inverter 232 and input of inverter 234, and a second current electrode of transistor 220 is coupled to the ground voltage supply terminal. A control electrode of transistor 220 is coupled to node D. An input of inverter 236 is coupled to an input of inverter 232 and output of inverter 234, and an output of inverter 236 is coupled to provide an output signal at the output terminal labeled OUT of input buffer 200.

The pre-charge circuit portion of input buffer 200 includes P-channel transistor 222 and N-channel transistor 224 coupled in a feedback configuration to receive the output signal at the OUT terminal. In this embodiment, transistors 222 and 224 are characterized as low threshold voltage transistors, thus allowing voltages at nodes A and B to be sustained by leakage currents when transistors 222 and 224 are substantially turned off or not conducting. A first current electrode of transistor 222 is coupled to the PBIAS voltage supply terminal, a second current electrode is coupled to the second terminal of capacitor 204 at node B, and a control electrode coupled to receive the output signal. A first current electrode of transistor 224 is coupled to the NBIAS voltage supply terminal, a second current electrode is coupled to the second terminal of capacitor 202 at node A, and a control electrode coupled to receive the output signal.

The enable circuit portion of input buffer 200 includes exemplary P-channel transistors 226-230 configured to enable and disable input buffer 200. The enable circuit portion is coupled to provide a predetermined logic value at the OUT terminal when the input buffer 200 is disabled Transistor 226-230 are configured to receive true and complementary enable signals provided at input terminals EN and ENB respectively. A first current electrode of transistor 226 is coupled to the PBIAS voltage supply terminal, a second current electrode is coupled to the second terminal of capacitor 204 at node B, and a control electrode coupled to receive the enable signal. A first current electrode of transistor 228 is coupled to the VDD voltage supply terminal, a second current electrode is coupled to the first current electrode of transistor 212, and a control electrode coupled to receive the complement enable signal. A first current electrode of transistor 230 is coupled to the VDD voltage supply terminal, a second current electrode is coupled to an output of inverter 232 and input of inverter 234, and a control electrode of transistor 230 is coupled to receive the enable signal. It may be desirable to forego the enable transistors 226-230 where enabling input buffer 200 is not required, for example, on inputs having continuous operation.

Figure 3:
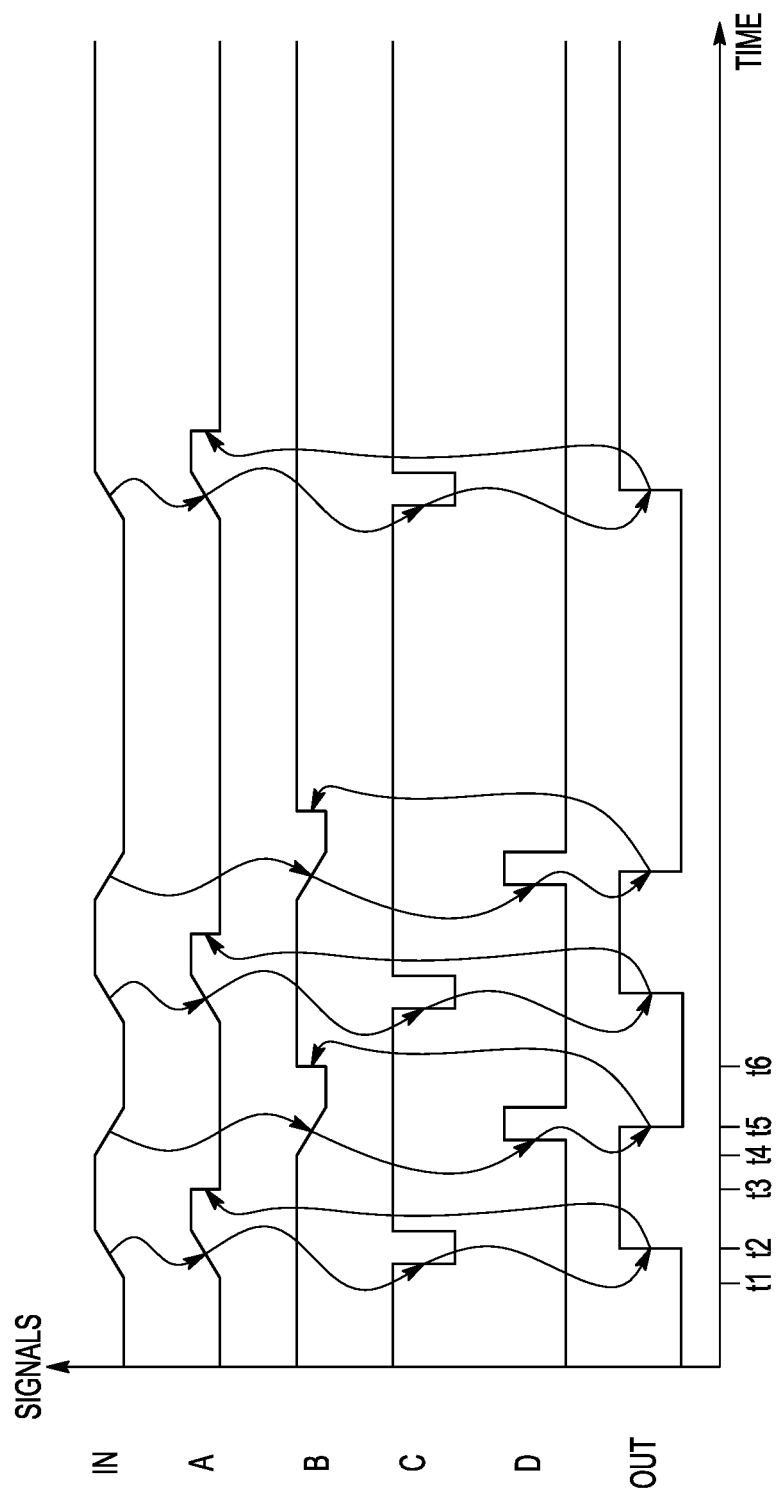
FIG. 3 illustrates, in timing diagram form, various signals of the buffer circuit in accordance with an embodiment of the present disclosure.

FIG. 3 illustrates, in timing diagram form, various signals of the exemplary input buffer circuit 200 in accordance with an embodiment of the present disclosure. The various signals waveforms include an exemplary input signal IN, intermediate signals at nodes A-D, and corresponding output signal OUT. Waveform signals are provided at the Y-axis and timing (e.g. t1-t6) of the signals is provided at the X-axis. By way of example, operation of the input buffer follows.

Input signal shown as the waveform labeled IN may be characterized as a small signal. A small signal may generally have a voltage swing in a range from a few hundred millivolts to several hundred millivolts. Because the input signal is capacitively coupled, the input circuit portion detects transitions of the input signal rather than absolute voltage of the input signal.

At marker t1, a rising edge of the input signal at the first terminal of capacitors 202 causes a corresponding rising edge at node A. The rising edge at node A in turn causes transistor 210 to momentarily turn on, generating a logic low pulse on node C. The logic low pulse on node C causes the latching portion to set or store a logic high value, and in turn, the output signal transitions to a logic high value at marker t2. Because the OUT terminal is coupled to the control electrode of transistor 224 in a feedback configuration, the logic high value of the output signal causes transistor 224 to turn on or conduct, which in turn pulls node A low at marker t3.

At marker t4, a falling edge of the input signal at the first terminal of capacitor 204 causes a corresponding falling edge at node B. The falling edge at node B in turn causes transistor 212 to momentarily turn on, generating a logic high pulse on node D. The logic high pulse on node D causes the latching portion to reset or store a logic low value, and in turn, the output signal transitions to a logic low value at marker t5. Because the OUT terminal is coupled to the control electrode of transistor 222 in a feedback configuration, the logic low value of the output signal causes transistor 222 to turn on or conduct, which in turn pulls node B high at marker t6.

Generally, there is provided, a buffer circuit including a first capacitor having a first terminal coupled to receive an input signal, and a second terminal; a second capacitor having a first terminal coupled to the first terminal of the first capacitor, and a second terminal; a latching portion having a first input coupled to the second terminal of the first capacitor and a second input coupled to the second terminal of the second capacitor, the latching portion providing an output signal at an output; a first transistor having a first current electrode coupled to a first bias voltage supply terminal, a second current electrode coupled to the second terminal of the second capacitor, and a control electrode to receive the output signal. The buffer circuit may further include a second transistor having a first current electrode coupled to a second bias voltage supply terminal, a second current electrode coupled to the second terminal of the first capacitor, and a control electrode to receive the output signal. The first bias voltage provided at the first bias voltage supply terminal may be greater than the second bias voltage provided at the second bias voltage supply terminal. The first transistor may be characterized as a low threshold voltage P-channel transistor, and the second transistor may be characterized as a low threshold voltage N-channel transistor. A first input coupled to the second terminal of the first capacitor may be coupled via a third transistor having a control electrode coupled to the second terminal of the first capacitor and a first current electrode coupled to the first input, and a second input coupled to the second terminal of the second capacitor may be coupled via a fourth transistor having a control electrode coupled to the second terminal of the second capacitor and a first current electrode coupled to the second input. The buffer circuit may further include a fifth transistor having a control electrode coupled to the first bias voltage supply terminal and a first current electrode coupled to the first input, and a sixth transistor having a control electrode coupled to the second bias voltage supply terminal and a first current electrode coupled to the second input. The latching portion may include a pair of cross-coupled inverters. The latching portion may further include a seventh transistor having a control electrode coupled to the first current electrode of the third transistor at the first input, and an eighth transistor having a control electrode coupled to the first current electrode of the fourth transistor at the second input, the seventh transistor configured such that when activated causes the latching portion to latch a first logic value, and the eighth transistor configure such that when activated causes the latching portion to latch a second logic value. The buffer circuit may further include enable circuitry coupled to provide a predetermined logic value at the output when the buffer circuit is disabled.

In another embodiment, there is provided, a buffer circuit including a first capacitor having a first terminal coupled to receive an input signal; a second capacitor having a first terminal coupled to the first terminal of the first capacitor; a first transistor having a control electrode coupled to a second terminal of the first capacitor, and a first current electrode coupled to a first voltage supply terminal; a second transistor having a control electrode coupled to a second terminal of the second capacitor, and a first current electrode coupled to a second voltage supply terminal; a latching portion coupled to a second current electrode of the first transistor and a second current electrode of the second transistor, the latching portion providing an output signal; and a third transistor having a first current electrode coupled to a first bias voltage supply terminal, a second current electrode coupled to the second terminal of the second capacitor, and a control electrode coupled to receive the output signal. The buffer circuit may further include a fourth transistor having a first current electrode coupled to a second bias voltage supply terminal, a second current electrode coupled to the second terminal of the first capacitor, and a control electrode coupled to receive the output signal. The buffer circuit may further include a fifth transistor having a control electrode coupled to the first bias voltage supply terminal and a first current electrode coupled to the second current electrode of the first transistor, and a sixth transistor having a control electrode coupled to the second bias voltage supply terminal and a first current electrode coupled to the second current electrode of the second transistor. The first bias voltage provided at the first bias voltage supply terminal may be greater than the second bias voltage provided at the second bias voltage supply terminal. The third transistor may be characterized as a low threshold voltage P-channel transistor, and the fourth transistor may be characterized as a low threshold voltage N-channel transistor. The latching portion may further include a seventh transistor having a control electrode coupled to the second current electrode of the first transistor, and an eighth transistor having a control electrode coupled to the second current electrode of the second transistor, the seventh transistor configured such that when activated causes the latching portion to latch a first logic value, and the eighth transistor configure such that when activated causes the latching portion to latch a second logic value. The latching portion may further include a cross-coupled pair of inverters coupled to a first current electrode of the seventh transistor and a first current electrode of the eighth transistor. The first current electrode of the second transistor may be coupled to the second voltage supply terminal by way of an enable transistor.

In yet another embodiment, there is provided, a method including receiving an input signal at a first terminal of a first capacitor and a first terminal of a second capacitor; latching a first logic value based on a capacitively coupled first edge of the input signal at the second terminal of the first capacitor; and using latched first logic value to pre-charge the second terminal of the first capacitor to a first bias voltage. The method may further include latching a second logic value based on a capacitively coupled second edge of the input signal at the second terminal of the second capacitor; and using latched second logic value to pre-charge the second terminal of the second capacitor to a second bias voltage. The method may further include pre-charging the second terminal of the first capacitor while the capacitively coupled second edge occurs at the second terminal of the second capacitor.

By now it should be appreciated that there has been provided, a buffer circuit and method to condition signals without excessive current drain and die area. The buffer circuit allows high frequency signals having a voltage swing of a few hundred millivolts to be received and converted to full rail signals. An input signal is received at a first terminal of a first capacitor and a first terminal of a second capacitor. A latching portion latches a logic value based on a capacitively coupled edge of the input signal at the second terminal of the first capacitor. An output signal of the latching portion is used to pre-charge the second terminal of the first capacitor to a first bias voltage. Similarly, a second logic value can be latched based on a capacitively coupled second edge of the input signal at the second terminal of the second capacitor. The output signal of the latching portion is used to pre-charge the second terminal of the second capacitor to a second bias voltage.

As used herein, the term "bus" is used to refer to a plurality of signals or conductors which may be used to transfer one or more various types of information, such as data, addresses, control, or status. The conductors as discussed herein may be illustrated or described in reference to being a single conductor, a plurality of conductors, unidirectional conductors, or bidirectional conductors. However, different embodiments may vary the implementation of the conductors. For example, separate unidirectional conductors may be used rather than bidirectional conductors and vice versa. Also, plurality of conductors may be replaced with a single conductor that transfers multiple signals serially or in a time multiplexed manner. Likewise, single conductors carrying multiple signals may be separated out into various different conductors carrying subsets of these signals. Therefore, many options exist for transferring signals.

Each signal described herein may be designed as positive or negative logic, where negative logic can be indicated by a bar over the signal name, an asterix (*) following the name, or the letter "B" at the end of the signal name. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Architectures depicted herein are merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the functionality of the above described operations are merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A buffer circuit, comprising:
   a first capacitor having a first terminal coupled to receive an input signal, and a second terminal;
   a second capacitor having a first terminal coupled to the first terminal of the first capacitor, and a second terminal;
   a latching portion having a first input coupled to the second terminal of the first capacitor and a second input coupled to the second terminal of the second capacitor, the latching portion providing an output signal at an output;
   a first transistor having a first current electrode coupled to a first bias voltage supply terminal, a second current electrode coupled to the second terminal of the second capacitor, and a control electrode to receive the output signal; and
   enable circuitry coupled to provide a predetermined logic value at the output when the buffer circuit is disabled.

2. The buffer circuit of claim 1, further comprising a second transistor having a first current electrode coupled to a second bias voltage supply terminal, a second current electrode coupled to the second terminal of the first capacitor, and a control electrode to receive the output signal.

3. The buffer circuit of claim 2, wherein the first bias voltage provided at the first bias voltage supply terminal is greater than the second bias voltage provided at the second bias voltage supply terminal.

4. The buffer circuit of claim 2, wherein the first transistor is characterized as a low threshold voltage P-channel transistor, and the second transistor is characterized as a low threshold voltage N-channel transistor.

5. The buffer circuit of claim 2, wherein the first input coupled to the second terminal of the first capacitor is coupled via a third transistor having a control electrode coupled to the second terminal of the first capacitor and a first current electrode coupled to the first input, and wherein the second input coupled to the second terminal of the second capacitor is coupled via a fourth transistor having a control electrode coupled to the second terminal of the second capacitor and a first current electrode coupled to the second input.

6. The buffer circuit of claim 5, further comprising a fifth transistor having a control electrode coupled to the first bias voltage supply terminal and a first current electrode coupled to the first input, and a sixth transistor having a control electrode coupled to the second bias voltage supply terminal and a first current electrode coupled to the second input.

7. The buffer circuit of claim 1, wherein the latching portion comprises a pair of cross-coupled inverters.

8. The buffer circuit of claim 7, wherein the latching portion further comprises a seventh transistor having a control electrode coupled to the first current electrode of the third transistor at the first input, and an eighth transistor having a control electrode coupled to the first current electrode of the fourth transistor at the second input, the seventh transistor configured such that when activated causes the latching portion to latch a first logic value, and the eighth transistor configure such that when activated causes the latching portion to latch a second logic value.

9. A buffer circuit, comprising:
a first capacitor having a first terminal coupled to receive an input signal;
a second capacitor having a first terminal coupled to the first terminal of the first capacitor;
a first transistor having a control electrode coupled to a second terminal of the first capacitor, and a first current electrode coupled to a first voltage supply terminal;
a second transistor having a control electrode coupled to a second terminal of the second capacitor, and a first current electrode coupled to a second voltage supply terminal;
a third transistor having a first current electrode coupled to a first bias voltage supply terminal, a second current electrode coupled to the second terminal of the second capacitor, and a control electrode coupled to receive an output signal; and
a latching portion coupled to a second current electrode of the first transistor and a second current electrode of the second transistor, the latching portion providing the output signal, the latching portion comprising:
a fourth transistor having a control electrode coupled to the second current electrode of the first transistor, the fourth transistor configured such that when activated causes the latching portion to latch a first logic value, and
a fifth transistor having a control electrode coupled to the second current electrode of the second transistor, the fifth transistor configure such that when activated causes the latching portion to latch a second logic value.

10. The buffer circuit of claim 9, further comprising a sixth transistor having a first current electrode coupled to a second bias voltage supply terminal, a second current electrode coupled to the second terminal of the first capacitor, and a control electrode coupled to receive the output signal.

11. The buffer circuit of claim 10, further comprising a seventh transistor having a control electrode coupled to the first bias voltage supply terminal and a first current electrode coupled to the second current electrode of the first transistor, and an eighth transistor having a control electrode coupled to the second bias voltage supply terminal and a first current electrode coupled to the second current electrode of the second transistor.

12. The buffer circuit of claim 10, wherein the first bias voltage provided at the first bias voltage supply terminal is greater than the second bias voltage provided at the second bias voltage supply terminal.

13. The buffer circuit of claim 10, wherein the third transistor is characterized as a low threshold voltage P-channel transistor, and the sixth transistor is characterized as a low threshold voltage N-channel transistor.

14. The buffer circuit of claim 9, wherein the latching portion further comprises a cross-coupled pair of inverters coupled to a first current electrode of the seventh transistor and a first current electrode of the eighth transistor.

15. The buffer circuit of claim 9, wherein the first current electrode of the second transistor is coupled to the second voltage supply terminal by way of an enable transistor.

16. A method comprising:
receiving an input signal at a first terminal of a first capacitor and a first terminal of a second capacitor;
generating a first pulse based on a capacitively coupled first edge of the input signal at the second terminal of the first capacitor, the first pulse causing a first logic value to be latched; and
using the latched first logic value to pre-charge the second terminal of the first capacitor to a first bias voltage.

17. The method of claim 16, further comprising:
generating a second pulse based on a capacitively coupled second edge of the input signal at the second terminal of the second capacitor, the second pulse causing a second logic value to be latched; and
using latched second logic value to pre-charge the second terminal of the second capacitor to a second bias voltage.

18. The method of claim 17, further comprising pre-charging the second terminal of the first capacitor while the capacitively coupled second edge occurs at the second terminal of the second capacitor.

19. The method of claim 16, wherein the first pulse is received at a first input of a latch circuit latching the first logic value, the latch circuit providing an output signal corresponding to the latched first logic value.

20. The method of claim 19, wherein using the latched first logic value to pre-charge the second terminal of the first capacitor to the first bias voltage comprises feeding back the output signal to a control terminal of a first transistor coupled to provide the first bias voltage to the second terminal of the first capacitor.

* * * * *